(12) United States Patent
Warmack et al.

(10) Patent No.: US 6,545,495 B2
(45) Date of Patent: Apr. 8, 2003

(54) METHOD AND APPARATUS FOR SELF-CALIBRATION OF CAPACITIVE SENSORS

(75) Inventors: Robert J. Warmack, Knoxville, TN (US); Charles L. Britton, Jr., Alcoa, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 09/837,142

(22) Filed: Apr. 17, 2001

(65) Prior Publication Data

US 2002/0158637 A1 Oct. 31, 2002

(51) Int. Cl.[7] .................. G01R 31/02; G21K 7/00
(52) U.S. Cl. ....................... 324/762; 250/306
(58) Field of Search ..................... 324/762, 761, 324/765, 752, 658, 690, 750, 244; 250/306, 216, 324; 73/105, 24.06

(56) References Cited

U.S. PATENT DOCUMENTS

| | | | |
|---|---|---|---|
| 5,436,448 A | * 7/1995 | Hosaka et al. | ............. 250/306 |
| 5,445,008 A | 8/1995 | Wachter et al. | |
| 5,719,324 A | 2/1998 | Thundat et al. | |
| 5,804,709 A | 9/1998 | Bourgoin et al. | |
| 6,016,686 A | 1/2000 | Thundat | |
| 6,078,174 A | * 6/2000 | Mukasa et al. | ............. 250/306 |
| 6,097,197 A | * 8/2000 | Matsuyama et al. | ........ 250/306 |
| 6,167,748 B1 | 1/2001 | Britton, Jr. et al. | |
| 6,337,478 B1 | * 1/2002 | Uehara et al. | ............. 250/216 |

OTHER PUBLICATIONS

"Sequential position readout from arrays of micromechanical cantilever sensors," by H.P. Lang, et al., *Appl. Phys. Lett.* 72(3) (Jan. 1998).

* cited by examiner

*Primary Examiner*—Christine Oda
*Assistant Examiner*—James Kerveros
(74) *Attorney, Agent, or Firm*—Akerman Senterfitt & Eidson, P.A.

(57) ABSTRACT

A method for determining operational characteristics of capacitive sensors adapted for self-calibration includes the steps of providing at least one capacitive sensor having a suspended element and a pick-up plate. An AC input signal is applied to one of the plates, while force is provided between the plates, the force capable of variation. At least one operational characteristic of capacitive sensors can be determined, such as the suspended element spring constant and the gap distance between the plates. A capacitive sensor system adapted for self-calibration includes at least one capacitive sensor having a suspended element and a pick-up plate, a self-testing and calibration network, and a structure for generating force between the plates, the force capable of variation.

48 Claims, 4 Drawing Sheets

METHOD AND APPARATUS FOR SELF-CALIBRATION OF CAPACITIVE SENSORS

The United States Government has rights in this invention pursuant to Contract No. DE-AC05-00OR22725 between the United States Department of Energy and UT-Battelle, LLC.

FIELD OF THE INVENTION

This invention relates generally to a method and apparatus for testing and calibrating sensors, and more particularly to a method and apparatus for testing and calibrating capacitive sensors.

BACKGROUND OF THE INVENTION

A need exists for a highly sensitive and selective detector capable of quantifying chemical, physical or biological presences or components in a monitored area. To be useful, such a detector should be small, rugged, inexpensive, selective, reversible and extremely sensitive. Applicants and/or the assignee of the invention (or its predecessors in interest) have invented other apparatus directed to this need; U.S. Pat. No. 5,719,324 to Thundat et al., U.S. Pat. No. 5,445,008 to Wachter et al. and U.S. Pat. No. 6,167,748 to Britton, Jr. et al. (Britton), which are all incorporated herein by reference.

The above references each disclose microcapacitive sensor technology which represents an electromechanical technique with broad applications in chemical, physical and biological detection. Depending on the dimensions of the microcapacitive sensor platform and the suspended element spring constant, deflections of these suspended elements can be detected with sub-angstrom precision using current techniques employed by atomic force microscopy (AMF) technology such as optical, piezoresistive, piezoelectric, capacitive, and electron tunneling.

Britton discloses arrayable, electronically read cantilever suspended elements which are selectively coated with certain chemicals to achieve a sensitivity to a specific physical, chemical or biological presence, e.g., relative humidity, mercury vapor, mercaptan, toluene, viscosity infrared and ultraviolet radiation, flow rate, lead in water, DNA hybridization, and antibody-antigen interaction. As the coatings react with the presence or component sensed, the resulting change in stress causes a deflection of the cantilever, which alters the spacing between the cantilever its associated lower "pick-up" plate. This spacing change is sensed as a change in capacitance, since capacitance of a parallel plate capacitor is inversely proportional to the plate separation distance. The change in capacitance is converted into a signal by a sensing circuit which is ultimately converted into a DC voltage output for further processing. An array of cantilevers with a variety of different coatings may be placed on a single chip in order to detect the simultaneous presence of multiple various chemical, physical or biological presences. As used herein, the process by which the presence of chemical, physical or biological presences is detected by a capacitive sensor is referred to as "field use" of the capacitive sensor.

Microelectromechanical sensors (MEMS) are a new class of microfabricated structures which generally feature mechanically moving components located on a plurality of die of silicon or other suitable bulk substrate material. Only recently have MEMS arrays been demonstrated for microcapacitive sensor technology to permit detection of various physical, chemical or biological agents based on changes in capacitance of a cantilever sensor. Capacitive actuation or readout is preferred for these sensors because of relative ease of integration and low-power requirements. Low power requirements enable battery power supplies for certain applications.

One common problem with MEMS fabrication processes is the yield. For example, thin sacrificial layers, such as $\mu$ or sub-$\mu$ layers of $SiO_2$ are commonly used to deposit the suspended layer (e.g. polysilicon) thereon. The sacrificial layer may then be removed to form the suspended element to complete the microcapacitive sensor. However, short gap distances common in these devices often result in incomplete removal of the sacrificial material in the gap. Another common yield problem is stiction, which occurs when two adjacent surfaces adhere. Various forms of contamination can also occur at the foundry, in subsequent processing, or in actual use. Methods are not currently available to diagnose yield problems such as those noted above during processing. Instead, these problems are typically only discovered at final assembly and test, after significant funds have typically been expended.

Another problem with MEMS sensors which use capacitive readouts is that their sensitivity can vary with residual stress. For example, the residual stress in polysilicon suspended elements used in surface-micromachined MEMS must be controlled so that warpage does not render the sensor unusable. Also, commonly applied coating layers generally result in stresses that can often significantly warp the normally thin suspended elements. Consequently, the gap between adjacent sensor capacitor plates can change affecting the magnitude of the mutual plate capacitance and as a result change the sensitivity of the sensor, the sensitivity being defined as signal output divided by sensory input.

If the gap distance were conveniently obtainable, microcapacitive sensor chips could be probed during processing, to determine whether to commit a given chip to costly assembly and post-assembly testing. In addition, during use, correction factors for the sensor's sensitivity could be determined and applied, and preferably updated periodically during the operation of the sensor. This is important since stresses to the suspended element can change over time or with environmental factors. Accordingly, it is desirable to recalibrate a microcapacitive sensor to account for changes in the gap distance and stiffness of the suspended element which can change over time. Calibration is highly desirable and can be essential for accurate detection required for most MEMS sensor applications. Thus, a convenient method for directly or indirectly measuring the gap distance and the stiffness of suspended elements in capacitive MEMS sensors is needed. The method and apparatus should preferably be fast, capable of automation and be adapted for implementation as an automatic imbedded self-test and calibration feature for finished capacitive sensor devices.

SUMMARY OF INVENTION

A method for determining operational characteristics of capacitive sensors includes the steps of providing at least one capacitive sensor, the capacitive sensor having plates. The plates include a suspended element and a pick-up plate, the suspended element capable of displacement relative to the pick-up plate by application of a force, the displacement and the force related by a spring constant. An AC input signal is applied to one of the plates, while force is provided between the plates. The force is capable of variation. Based on measured output values, at least one operational characteristic of the capacitive sensor is determined. The AC input signal can be a voltage signal or a current signal.

The method can determine a distance (gap) between the plates in the determining step. The force can include an electrostatic force provided by applying a DC bias between the plates. By varying the amplitude of the DC bias and measuring resulting AC output signals, a spring constant for the suspended element can be determined.

The force can include a magnetic force. To produce the magnetic force, the suspended element and the pick-up plate can be magnetic. Magnetic plates can be provided from plates having magnetically polarizable material and/or electromagnets.

Electrostatic and magnetic forces can be combined. For example, an electrostatic attractive force can be combined with a repulsive magnetic force. In one embodiment, the magnetic force is made substantially equal in magnitude and opposite in direction to the electrostatic force. The method can include the step of varying an amplitude of the DC bias while a magnetic force is applied, and measuring at least one resulting output signal, wherein a spring constant for the suspended element can be determined during the determining step.

The method can include the step of storing the determined spring constant and the gap. The method can include the step of applying at least one of the spring constant and the gap to field measurements made by the capacitive sensor. The spring constant and the gap can be automatically updated during the field use, and preferably be updated continuously.

A method for operating capacitive sensors includes the steps of providing at least one capacitive sensor and at least one self-testing and calibration network. The capacitive sensor has plates, the plates including a suspended element and a pick-up plate. An AC input signal is applied to one of the plates, and force is provided between the plates, the force capable of variation which allows at least one operational characteristic of the capacitive sensor to be determined. The spring constant for the suspended element and a gap between the plates can be determined during the determining step. The method can include the step of storing the spring constant and the gap.

The spring constant and the gap can be updated automatically during field use of the capacitive sensor. Upon generation of a measurement signal responsive to the detection of the presence of at least one material, at least one of the spring constant and the gap can be applied to the measurement signal.

A method for determining gap distances between capacitive sensor plates includes the steps of providing at least one capacitive sensor, the capacitive sensor having plates, the plates including a suspended element and a pick-up plate. An AC input signal is applied for generating a displacement current across the capacitive sensor, the AC input signal applied to one of the plates. A resulting output signal is measured and a gap distance between the plates is determined from the resulting measured output signal. The method can include the step of storing the gap data. The gap can be automatically updated during field use of the capacitive sensor, or preferably continuously updated during field use.

The method can also include the steps of generating a measurement signal during field use responsive to the detection of the presence of at least one material, and applying the gap to the measurement signal. In this embodiment, the gap can be automatically updated during field use, preferably continuously updated during field use.

A method for determining at least one operational characteristic of capacitive sensors includes the steps of providing at least one capacitive sensor, the capacitive sensor having a suspended element and a pick-up plate. Force is provided between the plates to provide a stress to the suspended element, the force capable of variation. An optical beam is directed onto the suspended element to generate a reflected beam. The reflected beam is then detected. An AC input signal can be applied to one of the plates to electrically measure a gap between the plates. If an AC signal is used, the method can further include the step of optically determining the gap using the detected reflected optical beam, wherein the electrical gap measurement can be compared to the optically determined gap.

A capacitive sensor system includes at least one capacitive sensor, the capacitive sensor including a suspended element and a pick-up plate and at least one self-testing and calibration network. The self-testing and calibration network includes a processor, the self-testing and calibration network being switchably connected to the capacitive sensor. A structure for generation of force between the plates is included, the force capable of variation. The processor can be adapted for determining parameters including a gap distance between the plates and a spring constant of the suspended element. The system can also include a memory.

The processor can be adapted to automatically apply at least one of the spring constant and the gap to measurement signals resulting from the detection of the presence of at least one material obtained during field use of the capacitive sensor. The spring constant and the gap can be periodically updated during field use. The updating can be continuous.

The structure for generation of force can include a DC bias applied between the plates to create an electrostatic force between the plates. Alternatively, the structure for generation of force can include magnetic suspended elements and pick-up plates to create a magnetic force between the plates. Magnetic plates can be formed by using magnetically polarizable material and/or electromagnets. The magnetic force can be substantially equal in magnitude and opposite in direction to the electrostatic force.

The system can also include a bulk substrate material having as plurality of die, at least one capacitive sensor formed on at least one die. A package can be included for bonding die to the package, wherein the self-testing and calibration network can be contained in the package with at least one of the capacitive sensors. Preferably, the self-testing and calibration network and at least one capacitive sensor can be formed on a single die. The system can include at least one oscillator circuit for generating an AC signal from a DC input. The oscillator can be formed on a die along with the testing and calibration network, and at least one capacitive sensor.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE PREFERRED EMBODIMENTS

A method and apparatus is described for testing and calibrating capacitive sensors with capacitive readouts using methods which are compatible with automated imbedded electronic programming. An AC forcing signal, such as an AC voltage or AC current, can be applied to one of the pair of sensor capacitor plates comprising a flexible suspended element and an adjacent fixed pick-up plate (collectively, the "plates"). The suspended element is capable of displacement by application of a force, the displacement and the force related by a spring constant. Measurement of the resulting output signal permits the plate separation distance or gap distance (d) to be obtained.

A variable force, such as a DC potential difference capable of variation, or a magnetic force capable of variation, can also be applied between the plates. The force provides a stress to the suspended element, the variation of the force modulating the gap between the plates, thereby modulating the plate capacitance.

In the case of an applied AC voltage signal, modulation of the distance between the plates by the force results in modulation of the resulting displacement current flowing between the capacitive sensor plates. In this case, the induced AC displacement current is proportional to the capacitance between the plates of the sensor.

Measured output signals can be used to verify the operation of the capacitive sensor by testing and determining parameters including, but not limited to, the continuity of electronic connections, mechanical flexure, initial position, and stiffness. The method can be used for in-line testing including pre-assembly die probe, final assembly testing as well for imbedded self-testing and automatic calibration for completed sensor devices, including testing and recalibrating capacitive sensors while in field use. Recalibrating while in field use permits compensation for accumulated materials on the suspended element surface, including target materials. The invention is applicable for any capacitively-read mechanical sensor, and is particularly applicable to microcapacitive sensors.

Figure 1A:
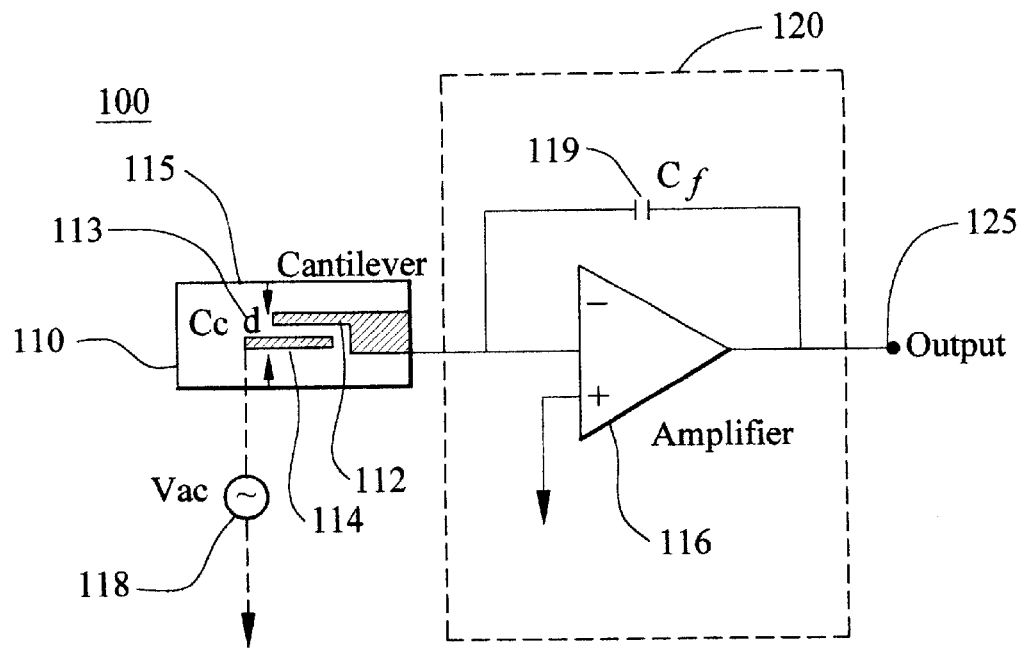
FIG. 1(a) illustrates a basic embodiment of the invention which shows a capacitive sensor system including an AC input voltage.

Referring to FIG. 1(a), a basic configuration of a capacitive sensor system 100 is shown which includes capacitive sensor 110, and testing apparatus comprising AC voltage source 118 and output sensing network 120, according to an embodiment of the invention. Output sensing network 120 includes amplifier 116 and feedback capacitor 119. Although the output sensing network 120 shown includes an amplifier, an amplifier may not be required in practicing some aspects of the invention. If an amplifier is used, amplifier 116 is preferably an operational amplifier, which is shown in an inverting configuration. Although not shown, numerous other operational amplifier inverting configurations as well as numerous non-inverting configurations can also be used with the invention. It is noted that the invention is in no way limited to the sensing network shown in FIG. 1(a) which uses an operation amplifier and can function using any suitable sensing network known in the art, the sensing network preferably being a low noise network.

The suspended element 112 shown is a cantilever element, which, together with pick-up plate 114 forms capacitive sensor 115. Although shown as a cantilever which is supported with one supporting member such as a single post, suspended element 112 can be formed from any suspended structure that provides flexure under stress, such as a suspended element supported at multiple ends such as two ends, or supported across an entire circumference as in the case of a suspended diaphragm element.

Figure 1B:
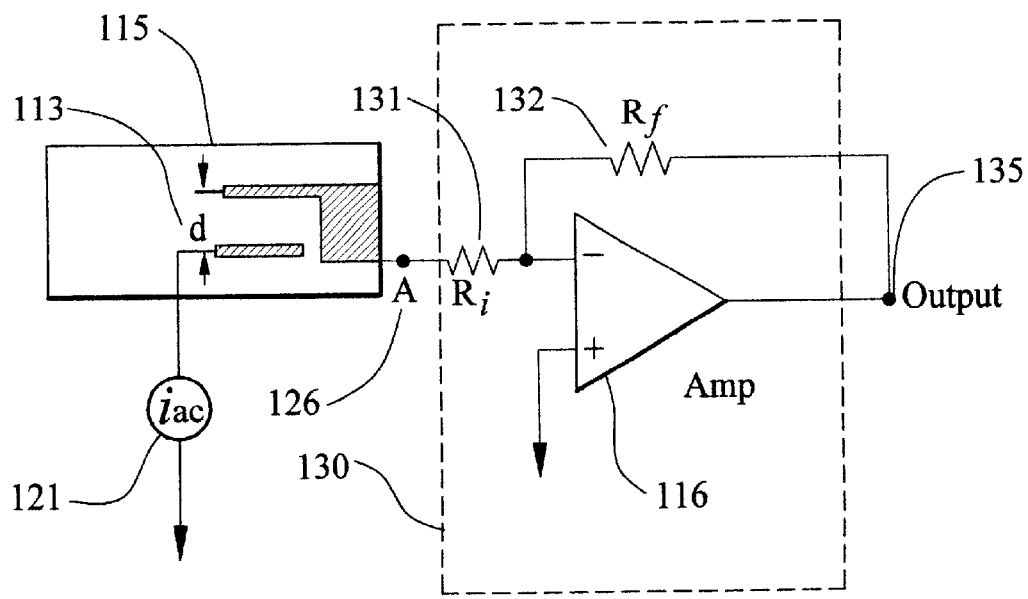
FIG. 1(b) illustrates another basic embodiment of the invention which shows a capacitive sensor system including an AC input current.

FIG. 1(b) shows another basic embodiment of the invention where the capacitive sensor system includes an AC current source 121. In the embodiments shown in either FIGS. 1(a) and 1(b), a circuit is provided for generating an AC input signal 118 and 121 for application to either the suspended element 112 or pick-up plate 114, while an output sensing circuit 120 or 130 processes the induced AC output signal transmitted.

In the case of an applied AC voltage signal as shown in FIG. 1(a), displacement current is generated which flows between the plates of the capacitive sensor 115. In this case, neglecting effects such as fringing fields and non-parallel surfaces, the magnitude of the induced displacement current flowing across capacitive sensor 115 is proportional to the capacitance of the sensor since:

$$C_c = \epsilon A/d,$$

where $C_c$ is the capacitance of the capacitive sensor 115, $\epsilon$ is the permittivity of the material filling the gap 113 between the plates (e.g. air), A is the effective plate area and d is distance (gap) between the suspended element 112 and pick-up plate 114. Although written in equation form, all relationships noted herein are understood to be approximate or "ideal" relationships. The circuit shown in FIG. 1(a) has a voltage output, $V_{out}$ 125, which is given by the following relation:

$$V_{out} = -V_{ac} (C_c/C_f)$$

where $C_f$ is the capacitance of the feedback capacitor 119. It is noted that as the gap distance 113 increases, $V_{out}$ 125 decreases, while if the gap distance 113 decreases, $V_{out}$ 125 will increase. In the preferred embodiment, the AC input signal is a voltage signal having a frequency from between 1 KHz and 10 MHz, having a magnitude of from approximately 1 µv rms to 10 v rms. Thus, the gap distance 113 of capacitive sensor 115 can be readily determined using the circuit shown in FIG. 1(a).

Alternatively, the AC input signal can be an alternating current signal 121 as shown in FIG. 1(b) to determine gap distance 113. The AC voltage at node A ($V_a$) 126 and the output voltage $V_{out}$ 135 can be expressed as:

$$V_a = X_c (i_{ac}) = (1/j\omega C_c) (i_{ac})$$

$$V_{out} = -(V_a) R_f/R_i$$

where $X_c$ is the capacitive reactance of the capacitor, $\omega$ is the angular frequency of the electrical signal, j is the square root of −1, $C_c$ is the capacitance of capacitive sensor 115, and $R_f$ 132 and $R_i$ 131 are the feedback and input resistors of amplifier 116, respectively. Since $V_a$ 126 is proportion to gap distance 113, $V_{out}$ 135 will increase (in magnitude) as the gap distance increases, while $V_{out}$ will decrease as the gap distance 113 decreases. In the preferred embodiment, the AC current signal 121 has a frequency between 1 KHz and 10 MHz, having a magnitude of from 1 µA rms to 0.1 A rms. Thus, the gap distance 113 of capacitive sensor 115 can be readily determined using the circuit shown in FIG. 1(b).

Gap distance alone may be sufficient for calibration of capacitive sensors for certain applications. By assuming a spring constant (e.g. based on the suspended element material used), the deflection of a suspended element in field use can be converted to a quantity of a specific physical, chemical or biological presence. However, the spring constant can vary for a given material, vary based on the thickness of the coating layer, and can vary over time due to many possible factors (e.g. environmental). Accordingly, it is desirable to measure the spring constant, preferably with a method which permits calibration updates during field use of the capacitive sensor.

Force can be provided between suspended element 112 and the pick-up plate 114 to permit determination of the spring constant (stiffness) of suspended element 112. By varying the magnitude of the force, a measure of the mechanical stiffness of a suspended element, such as suspended cantilever element 112, can be determined using a capacitive sensor system such as the one shown in FIG. 2, in addition to the determination of gap distance 113.

Figure 2:
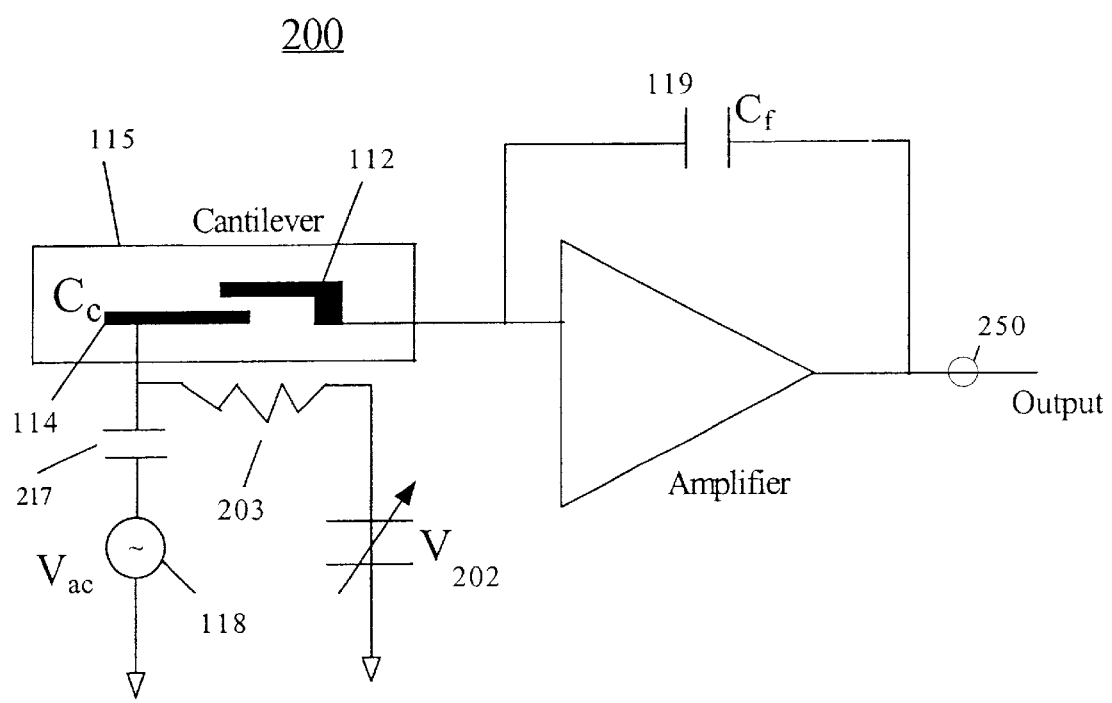
FIG. 2 illustrates an embodiment of the invention which shows a capacitive sensor system including an electrostatic force capable of variation and an AC input voltage.

FIG. 2 illustrates an embodiment of the invention which shows a capacitive sensor system 200 which utilizes an electrostatic force capable of variation. System 200 includes DC bias source 202, which through series resistor 203 provides a DC potential on pick-up plate 114. The DC potential generates an electrostatic attractive force capable of variation between suspended element 112 and pick-up plate 114 of capacitive sensor 115. AC input voltage 118 is capacitively coupled to pick-up plate 114 through coupling capacitor 217.

For example, the force can be an electrostatic force generated by application of a DC potential difference (DC bias) between suspended element 114 and pick-up plate 112. A DC bias capable of variation 202 can be generated through use of at least one conventional DC power supply. DC bias 202 will be blocked by capacitive sensor 115 and will accordingly have no direct effect on $V_{out}$ 250.

However, application of a DC bias 202 between suspended element 112 and pick-up plate 114 as shown in FIG. 2, causes the suspended element 112, such as a cantilever, to be attracted to and be deflected toward pick-up plate 114, according to the capacitance of the capacitive sensor 115, the DC bias applied, and the mechanical properties (e.g. stiffness) of the suspended element 112. By varying the DC bias 202, while applying an AC input signal to one of the plates of the capacitive sensor 115, such as an AC voltage 118 to either plate 112 or 114, a measure of the mechanical stiffness of the cantilever can be determined. The electrostatic force between the suspended element 112 and the pick-up plate 114 is given by the following relation:

$$F = -\epsilon A/2(V_{bias}/d)^2$$

where $V_{bias}$ is the magnitude of the applied DC bias. Correction terms to the above equation can be included to compensate for effects such as fringing fields and non-parallel surfaces. For small displacements of the suspended element 112 ($\delta d$), Hooke's law relates the applied force and the displacement according to the following relation:

$$F = -k\,\delta d$$

where k is the spring constant of the suspended element 112, that being a measure of its stiffness. Combining the above two equations above leads to the following relation:

$$\delta d = -(\epsilon A/2k)\,(V_{bias}/d)^2$$

Figure 3:
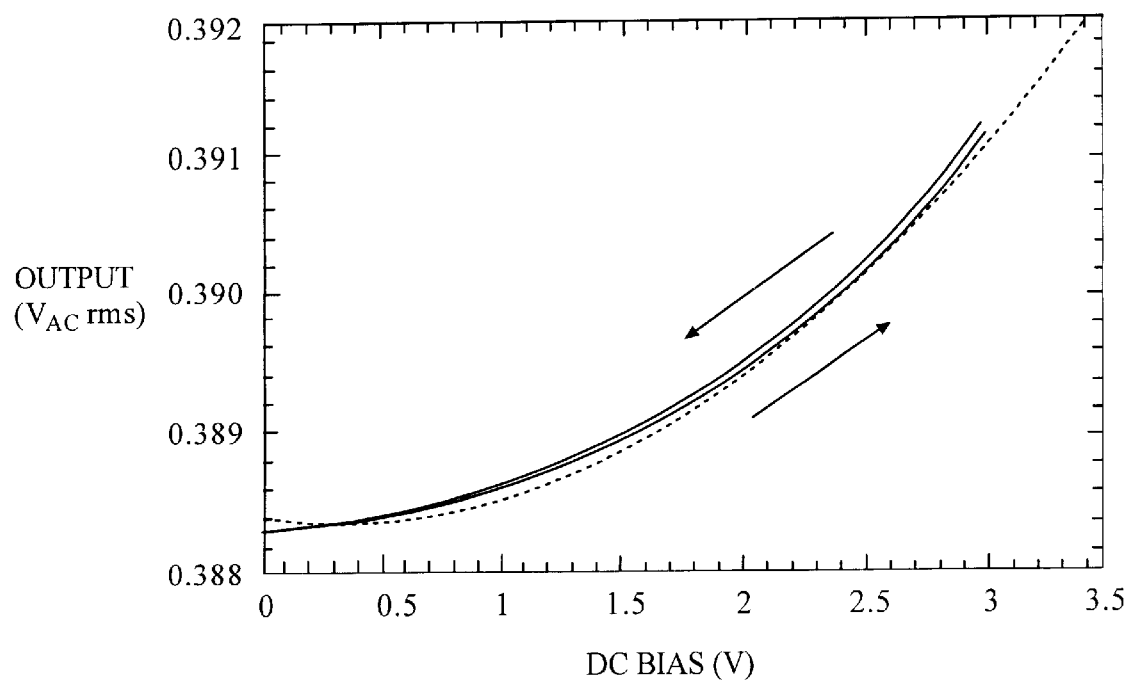
FIG. 3 illustrates a representative output from the sensor circuit shown in FIG. 2 demonstrating substantially elastic reversible deflection.
Figure 4:
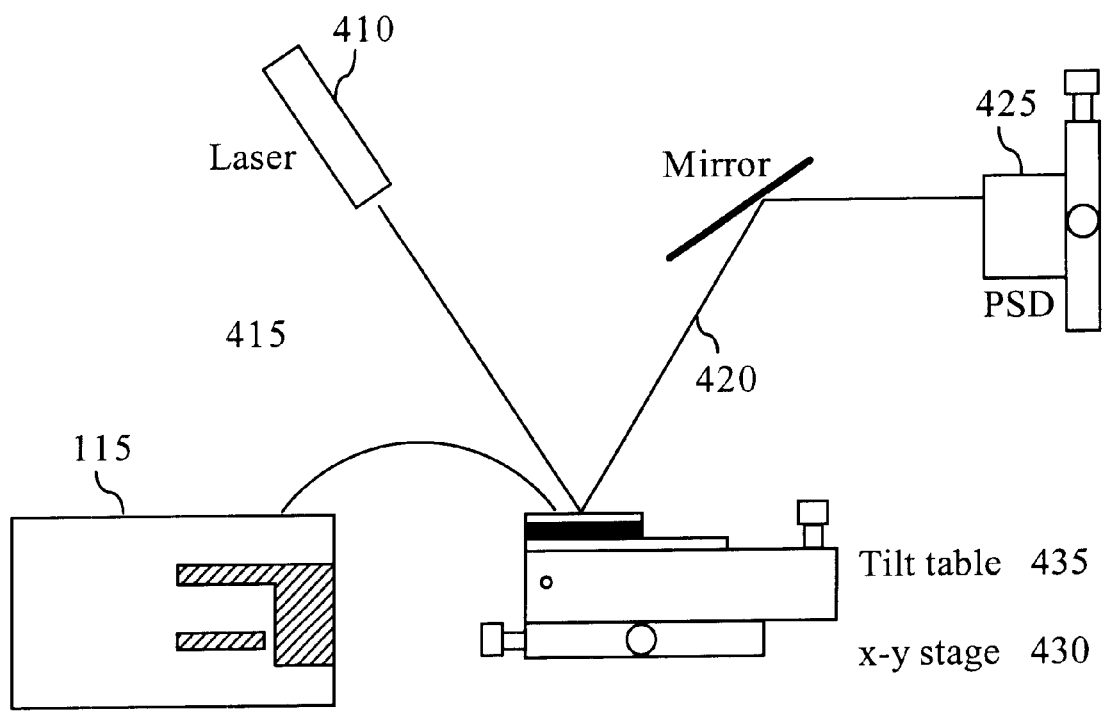
FIG. 4 illustrates another embodiment of the invention where the sensor system includes an optical apparatus to monitor the bending of a suspended element.

Thus, since $d = (V_{ac}\epsilon A)/(V_{out}C_f)$, the above equation predicts $V_{out}$ to be proportional to the square of $V_{bias}$. Thus, $V_{out}$ is expected to be parabolically related to $V_{bias}$. FIG. 3 shows $V_{out}$ 125 data measured using the capacitive sensor system shown in FIG. 1. By obtaining at least two data points of $V_{out}$ as a function of $V_{ac}$ and $V_{bias}$, the spring constant k of the suspended element can be determined from the following relation:

$$k = \left(\frac{C_f}{2}\right)\left(\frac{C_f}{\epsilon A}\right)^2 \left[\frac{\left(\frac{V_{ac2}V_{bias2}}{V_{out2}}\right)^2 - \left(\frac{V_{ac1}V_{bias1}}{V_{out1}}\right)^2}{\left(\frac{V_{ac2}}{V_{out2}} - \frac{V_{ac1}}{V_{out1}}\right)}\right]$$

In the example shown in FIG. 3, probes were connected to a capacitive sensor which was formed on a die, where a plurality of die were formed on a bulk substrate wafer. The wafer was placed on an electrically conductive surface. The DC bias voltage $V_{bias}$ was ramped from 0 V to 3 V and then back to 0 V. The AC input signal used was a voltage signal $V_{ac}$ having an amplitude of approximately 0.078 $V_{ac}$ rms at a frequency of 100 KHz. The capacitance of the capacitive sensor and the feedback capacitor were both approximately 1 pF. The dotted line shown is a linear-least-squares fit of a second order function (i.e. $V_{out}$ proportional to $V^2_{bias}$). Arrows denote the direction of the $V_{bias}$ change (3 V to 0 V, then 0 V to 3 V). It is noted that the respective curves for sweeps up in voltage and down in voltage nearly overlap for the device shown in FIG. 3. Thus, the device shown in FIG. 3 demonstrates good reversibility (also referred to as elasticity) of the suspended element, which is desirable for proper capacitive sensor operation.

The large offset in the output voltage signal $V_{out}$ is primarily due to the capacitance of the capacitive sensor, including the contribution of parasitic fringing capacitance. The variation in output voltage $V_{out}$ with $V_{bias}$ is due to the deflection of the suspended element 112 under the applied electrostatic force.

Alternatively, the force can be of magnetic origin. By providing a suspended element 112 and pick-up plate 114 having significant magnetic properties, magnetic forces can be created between the plates. Magnetic capacitive sensor plates can be provided through from the use of magnetically polarizable material (e.g. ferrite or metal magnetic materials) or through the use of electromagnets embedded within or adjacent to the plates. Assuming proper magnetic orientation between the suspended element 112 and the pick-up plate 114, an attractive or repulsive magnetic force can result. The magnitude of the magnetic force can be made variable, based on well known principles known in the art.

For example, in the case of electromagnets, the current can be changed to alter the resulting magnetic force. Two electromagnets experience a force that varies with the current flowing in each electromagnet. For parallel coils oriented and carrying currents $I_1$ and $I_2$ in a direction perpendicular to the x-direction, the mutual magnetic force between the coils in the x-direction is given by the following relation:

$$F_x = I_1 I_2\,(\delta M/\delta x); \text{ where } M \text{ is the mutual inductance between the coil circuits.}$$

The force can be made attractive (opposing current directions) or repulsive (parallel current directions), and varied by changing either or both electromagnet currents. Accordingly, a magnetic force can be used to provide a stress to strain the suspended element of a capacitive sensor, such as a cantilever.

By orienting plate magnets to create magnetic attraction between the suspended element and the pick-up plate and applying an AC signal between the plates while varying the magnetic force, the spring constant of the cantilever (k) can be determined. As in the case of an applied electrostatic force, Hooke's law can be combined with the equation above to relate the incremental displacement of the suspended element with the coil current in the case of electromagnetic plates. By obtaining at least two measurements of the resulting output signal as a function of the coil current in this case, the spring constant (k) of the suspended element can be determined.

In another embodiment of the invention, an attractive force (e.g. an electrostatic or magnetic) force is applied in combination with a repulsive force (e.g. electrostatic or magnetic). To generate a repulsive electrostatic force, active circuits are generally required for each sensor plate, unlike the generation of an attractive electrostatic force. For example, a combination of an appropriate DC bias can be used to electrostatically attract the capacitor plates together and repulsive magnetic force can allow the respective forces to be offset (balanced) in whole or in part.

In the preferred embodiment, the attractive force is electrostatic while the repulsive force is magnetic, the respective forces substantially balancing one another. Attractive and repulsive force combinations can be used to provide an additional means to characterize and/or diagnose the action of the capacitive sensor. For, example, a combination of electrical and magnetic force can be used to extend the dynamic range of the capacitive sensor. In one embodiment, the capacitive displacement signal could be held constant by an appropriate feedback circuit, the output signal being a measure of the electrical and magnetic signals necessary to provide a force balance.

Optical methods can also be used with the invention. Optical methods permit pixel type area resolution, in contrast to electrical and/or magnetic methods which typically can only generate only scalar measures. Optical deflection can be used to monitor bending of the plurality of area portions comprising the suspended element while the suspended element is forced to move by means of applied electric or magnetic forces. The monitoring can include measurement of the gap distance between the plates of the cantilever sensor. Optical methods can preferably be combined with methods to move the plates (e.g. magnetic or electrostatic) to determine mechanical flexure, initial position and stiffness of the suspended element. Alternatively, optical methods can be used for confirmation data, for example when an electrical AC input signal is used along with a force capable of magnitude variation to determine the gap distance and flexure data.

An optical beam, such as a laser beam 410, can be focussed to a spot on suspended element 415. The reflected beam 420 can then be used to illuminate a suitable detector, such as a quadrant position-sensitive detector (PSD) 425. Slope changes (motion) of the suspended element 415 at a plurality of discrete points (areas) can be sensitively detected by this method by movement of the laser beam 410 relative to a given sample to be tested. For example, tilt table 435 equipped with X-Y stage 430 can be used for this purpose.

Measurements according to the invention can be performed by probing a capacitive sensor die during processing, at probe level testing upon wafer level completion, after mounting in a package but before wire bonding. Probing at these various levels is analogous to probing and testing levels used in a typical integrated electronics or opto-electronics process. Die can each include one or a plurality of capacitive sensors, each capacitive sensor capable of being sensitized to detect the simultaneous presence of multiple various chemical, physical or biological presences.

Probing capacitive sensors while still in die form on bulk substrates (e.g. Si wafer) prior to assembly is especially useful as it enables the determination of process control information. For example, suspended element (e.g. cantilever) coating quality, electrical isolation between the suspended element and its associated pick-up plate can be used to determine whether or not to commit individual capacitive sensor die to the expense of packaging and testing. The effects of each operation as well as the relative and absolute characteristics of each capacitive sensor chip formed can be used as a process monitor and for quality control purposes for both the fabrication as well as for the assembly process.

Capacitive sensors can be tested after bonding and packaging, including during field use. Testing and calibration can be preferably provided by embedding the ability to test and calibrate within the capacitive sensor system, such as within the control and readout circuit. In one embodiment, a "hybrid" embodiment, one or more capacitive sensor chips can be mounted in a package with one or more die providing support components, the support die providing components such as a bias control circuits, timing circuits, switches, A/D converters, memory (including at least some writeable memory), processors (e.g. CPU, microcontroller, etc.), for support of testing and calibrating capacitive sensors. In a more preferred embodiment, individual die can be "self-contained," preferably including the support components and one or more capacitive sensors on each die to implement a monolithic self-calibrating capacitive sensor.

As used herein, "self-calibrating" referes refers to automatic calibration and recalibration while "self-testing" refers to automatic testing (i.e., requiring no human intervention). Importantly, testing and self-calibration can occur while the capacitive sensor is in field use. No interruption of sensor function is required to implement the method. Accordingly, the method can provide real-time continuous capacitive sensor recalibration.

For a typical capacitive readout sensor, a low-noise amplifier and sensing circuit may already be provided. Thus, to implement a self-calibrating embodiment of the invention, the additional components needed would comprise a bias-control circuit that could be switched on and off to capactive sensors at desired intervals (including continuously) and a processor to implement decision logic to determine critical operating characteristics about each capacitive sensor.

The ability to perform periodic testing and self-calibration in the field is particularly useful because field use frequently results in sensors coming into contact with environments that may cause damage or changes to the devices. In addition, temperature extremes or vibration may temporarily disable or otherwise disturb the capacitive sensor. Since temperature and vibration variations are difficult to artificially introduce into a device while in the field, the invention can provide a simple and real-time dynamic functional check that could ensure both operation and calibration. Thus, testing and calibration using the invention can be made automatic through execution of stored programmed self-test modes for the operation and calibration for each capacitive sensor.

In the event a die can contains a plurality of capacitive sensors, a single testing and calibration apparatus can preferably be used to periodically test and calibrate all sensors on each die. In this more preferred embodiment, die can each be provided one or more appropriate sensing circuits, timing circuits, switches, executable stored program codes, processors and other structures to implement a monolithic self-calibrating capacitive sensor.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

We claim:

1. A method for determining operational characteristics of capacitive sensors, comprising the steps of:
    providing at least one capacitive sensor, said capacitive sensor having plates, said plates including a suspended element and a pick-up plate, said suspended element capable of displacement relative to said pick-up plate by application of a force, said displacement and said force related by a spring constant;
    applying an AC input signal to one of said plates,
    providing force between said plates, said force capable of variation,
    measuring a displacement current signal or a signal derived from said displacement current which is induced by application of said AC input signal to one of said plates, and
    determining at least one operational characteristic of said capacitive sensor from parameters including said measured displacement current signal or a signal derived from said displacement current signal.

2. The method of claim 1, wherein said AC input signal is a voltage signal.

3. The method of claim 1, wherein said AC input signal is a current signal.

4. The method of claim 1, wherein a distance (gap) between said plates is determined in said determining step.

5. The method of claim 4, wherein said force includes an electrostatic force provided by applying a DC bias between said plates.

6. The method of claim 5, further comprising the steps of varying an amplitude of said DC bias and measuring at least one resulting output signal, wherein a spring constant for said suspended element is determined during said determining step.

7. The method of claim 5, wherein said force includes a magnetic force between said plates.

8. The method of claim 7, wherein said magnetic force is a repulsive force.

9. The method of claim 7, wherein said magnetic force is substantially equal in magnitude and opposite in direction to said electrostatic force.

10. The method of claim 7, further comprising the step of varying an amplitude of said DC bias and measuring at least one resulting output signal, wherein a spring constant for said suspended element is determined during said determining step.

11. The method of claim 10, further comprising the step of applying at least one of said spring constant and said gap to field measurements made by said capacitive sensor.

12. The method of claim 11, wherein at least one of said spring constant and said gap is automatically updated during said field use.

13. The method of claim 12, wherein at least one of said spring constant and said gap is continuously updated during said field use.

14. The method of claim 1, wherein said force includes a magnetic force.

15. The method of claim 14, further comprising the step of providing magnetic ones of said suspended element and said pick-up plate.

16. The method of claim 15, wherein said providing magnetic ones includes providing said plates with at least one source of magnetism selected from the group of magnetically polarizable material and electromagnets.

17. The method of claim 1, wherein a spring constant and a gap is determined in said determining step, further comprising the step of storing said spring constant and said gap.

18. A method for operating capacitive sensors, comprising the steps of:
    providing at least one capacitive sensor and at least one self-testing and calibration network, said capacitive sensor having plates, said plates including a suspended element and a pick-up plate, said suspended element capable of displacement relative to said pick-up plate by application of a force, said displacement and said force related by a spring constant;
    applying an AC input signal to one of said plates,
    providing force between said plates, said force capable of variation,
    measuring a displacement current signal or a signal derived from said displacement current which is induced by application of said AC input to one of said plates, and
    determining at least one operational characteristic of said capacitive sensor from parameters including said measured displacement current signal or a signal derived from said displacement current signal.

19. The method of claim 18, wherein at least one of a spring constant for said suspended element and a gap between said plates is determined during said determining step.

20. The method of claim 18, further comprising the step of storing at least one of said spring constant and said gap.

21. The method of claim 19, wherein at least one of said spring constant and said gap are updated automatically during field use of said capacitive sensor.

22. The method of claim 19, further comprising the steps generating a measurement signal responsive to the detection of the presence of at least one material, and applying at least one of said spring constant and said gap to said measurement signal.

23. The method of claim 21, wherein both said spring constant and said gap are applied to said measurement signal.

24. A method for determining gap distances between capacitive sensor plates, comprising the steps of:
    providing at least one capacitive sensor, said capacitive sensor having plates, said plates including a suspended element and a pick-up plate, said suspended element capable of displacement relative to said pick-up plate by application of a force, said displacement and said force related by a spring constant;
    applying an AC input signal to one of said plates for generating a displacement current signal across said capacitive sensor;
    measuring said displacement current signal or a signal derived from said displacement current, and
    determining a gap distance between said plates from said resulting output signal from parameters including said measured displacement current signal or a signal derived from said displacement current signal.

25. The method for claim 24, further comprising the step of storing said gap.

26. The method for claim 24, further comprising the step of automatically updating said gap during field use of said capacitive sensor.

27. The method for claim 26, wherein said gap is continuously updated during said field use.

28. The method for claim 24, further comprising the steps of generating a measurement signal during field use responsive to the detection of the presence of at least one material, and applying said gap to said measurement signal.

29. The method of claim 28, wherein said gap is automatically updated during said field use.

30. The method of claim 29, wherein said gap is continuously updated during said field use.

31. A method for determining at least one operational charactertistic of capacitive sensors, comprising the steps of:

providing at least one capacitive sensor, said capacitive sensor having plates, said plates including a suspended element and a pick-up plate, said suspended element capable of displacement relative to said pick-up plate by application of a force, said displacement and said force related by a spring constant;

providing force between said plates, said force capable of variation;

applying an AC input signal to one of said plates to produce a displacement current through said capacitive sensor;

directing an optical beam onto said suspended element to generate a reflected beam;

detecting said reflective optical beam, and determining at least one operational characteristic of said capacitive sensor from parameters including said measured displacement current signal or a signal derived from said displacement current signal.

32. The method of claim 31, wherein said operational characteristic include a gap between said plates.

33. The method of claim 32, further comprising the step of optically determining said gap using said detected optical beam, wherein a measured electrical gap can be compared to said optically determined gap.

34. A capacitive sensor system, comprising:

at least one capacitive sensor, said capacitive sensor having plates, said plates including a suspended element and a pick-up plate, said suspended element capable of displacement relative to said pick-up plate by application of a force, said displacement and said force related by a spring constant;

at least one self-testing and calibration network switchably connected to said capacitive sensor, said self-testing and calibration network including a processor, structure for generation of force between said plates, said force capable of variation, structure for applying an AC input signal to one of said plates, and structure for measuring a displacement current signal or a signal derived from said displacement current which is induced by application of said AC input signal across said capacitive sensor.

35. The system of claim 34, wherein said processor is adapted for determining parameters including at least one of a gap distance between said plates and a spring constant of said suspended element.

36. The system of claim 34, further comprising a memory.

37. The system of claim 34, wherein said processor is adapted to automatically apply at least one of said spring constant and said gap to measurement signals resulting from the detection of the presence of at least one material obtained during field use of said capacitive sensor.

38. The system of claim 37, wherein at least one of said spring constant and said gap is periodically updated during said field use.

39. The system of claim 38, wherein at least one of said spring constant and said gap is continuously updated during said field use.

40. The system of claim 34, wherein said structure for generation of force includes a DC bias applied between said plates, said DC bias creating an electrostatic force between said plates.

41. The system claim 34, wherein structure for generation of force includes magnetic ones of said suspended element and said pick-up plate, said magnet ones creating a magnetic force between said plates.

42. The system of claim 41, wherein said magnetic ones includes at least one source of magnetism selected from the group of magnetically polarizable material and electromagnets.

43. The system of claim 41, wherein said magnetic force is substantially equal in magnitude and opposite in direction to an electrostatic force between said plates.

44. The system of claim 34, further comprising a bulk substrate material having a plurality of die, at least one of said capacitive sensors formed on at least one of said plurality of die.

45. The system of claim 44, further comprising a package for bonding die to said package, wherein said self-testing and calibration network is contained in said package with at least one of said capacitive sensors.

46. The system of claim 45, wherein said self-testing and calibration network and at least one of said capacitive sensors are formed on a single one of said plurality of die.

47. The system of claim 45, further comprising at least one oscillator circuit for generating an AC signal from a DC input.

48. The system of claim 47, wherein said self-testing and calibration network, said oscillator circuit and at least one of said capacitive sensors formed on at least one of said plurality of die.

* * * * *